(12) United States Patent
English et al.

(10) Patent No.: US 11,119,126 B2
(45) Date of Patent: Sep. 14, 2021

(54) SLOPE DETECTOR FOR VOLTAGE DROOP MONITORING

(71) Applicant: International Business Machines Corporation, Armonk, NY (US)

(72) Inventors: Erik English, Poughkeepsie, NY (US); Michael Sperling, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 155 days.

(21) Appl. No.: 16/519,108

(22) Filed: Jul. 23, 2019

(65) Prior Publication Data

US 2021/0025926 A1 Jan. 28, 2021

(51) Int. Cl.
*G01N 27/416* (2006.01)
*G01R 19/165* (2006.01)
*G01R 17/02* (2006.01)
*G01R 19/175* (2006.01)

(52) U.S. Cl.
CPC ........... *G01R 19/165* (2013.01); *G01R 17/02* (2013.01); *G01R 19/175* (2013.01)

(58) Field of Classification Search
CPC ............ G01R 19/165; G01R 19/16552; G01R 19/16547; G01R 19/16542; G01R 19/175; G01R 19/0084; G01R 17/02; G01R 31/2841; G01R 31/31924
See application file for complete search history.

(56) References Cited

U.S. PATENT DOCUMENTS

| 4,906,864 | A | 3/1990 | McCorkle |
| 5,426,386 | A * | 6/1995 | Matthews ........ G01R 19/16542 327/205 |
| 7,528,619 | B2 | 5/2009 | Paillet et al. |
| 7,710,084 | B1 | 5/2010 | Guo |
| 8,060,766 | B2 | 11/2011 | Konstadinidis et al. |
| 9,841,776 | B1 | 12/2017 | Bari et al. |
| 10,054,617 | B2 * | 8/2018 | Li ......................... H02M 3/158 |
| 10,145,868 | B2 | 12/2018 | Chong et al. |

(Continued)

FOREIGN PATENT DOCUMENTS

| WO | 2015119971 A1 | 8/2015 |
| WO | 2016160559 A1 | 10/2016 |
| WO | 2018160578 A1 | 9/2018 |

OTHER PUBLICATIONS

D. Kamakshi, "Modeling and Design for Low Power and Variation Tolerance in Integrated Circuits," Dec. 2017. 123 Pages.

(Continued)

*Primary Examiner* — Thang X Le
(74) *Attorney, Agent, or Firm* — Cantor Colburn LLP; Margaret McNamara

(57) ABSTRACT

Techniques for a slope detector for voltage droop monitoring are described herein. An aspect includes receiving an input voltage by a circuit. Another aspect includes producing, by the circuit, a filtered offset voltage based on the input voltage. Another aspect includes determining whether the input voltage is lower than the filtered offset voltage. Yet another aspect includes, based on the input voltage being lower than the filtered offset voltage, indicating an imminent voltage droop condition in the input voltage.

17 Claims, 2 Drawing Sheets

(56) References Cited

U.S. PATENT DOCUMENTS

| | | |
|---|---|---|
| 10,162,373 B1 | 12/2018 | Chong et al. |
| 2007/0290657 A1 | 12/2007 | Cretella et al. |
| 2009/0284239 A1* | 11/2009 | Feng .................... H02M 3/156 |
| | | 323/284 |
| 2017/0261537 A1* | 9/2017 | Chong ............... G01R 31/3004 |
| 2018/0013348 A1* | 1/2018 | Paul ...................... H02M 3/158 |
| 2018/0284828 A1 | 10/2018 | Mosalikanti et al. |
| 2019/0044442 A1 | 2/2019 | Schaef |

OTHER PUBLICATIONS

English et al., "Autozero to an Offset Value for a Slope Detector for Voltage Droop Monitoring," U.S. Appl. No. 16/519,105, filed Jul. 23, 2019.
IBM "List of IBM Patents or Patent Applications Treated as Related; (Appendix P)", Filed Jul. 23, 2019, 2 pages.
Quinn et al., "Droop Compensation Versus Ideal Regulation", Power Electronics Technology, Nov. 2004. 2 Pages.

\* cited by examiner

SLOPE DETECTOR FOR VOLTAGE DROOP MONITORING

BACKGROUND

The present invention generally relates to integrated circuits, and more specifically, to a slope detector for voltage droop monitoring in integrated circuits.

In high performance processors or other integrated circuits, to increase the processing performance of the processor, the processor chip design may include one or more of one or more processor cores and one or more pipelines connecting the processor cores. In addition, in a high performance system, processor system designs often include multiple chips sharing a common supply rail of a power distribution network providing a supply voltage. As the number of processor cores on a same chip or across multiple chips, all sharing a common supply rail, increases, the number of circuits that switch per clock cycle also increases.

In a processor there is noise generated by circuit switching activity at each clock cycle by nodes, busses, and other circuit components sharing a common supply rail. One result of noise generated by circuit switching activity, also referred to as power grid noise or di/dt noise, is that a sudden increase in noise may induce a droop in the supply voltage to the common supply rail of the power distribution network. A sudden, large droop in the supply voltage slows down the circuit response and therefore may cause timing errors on the logical circuit.

SUMMARY

Embodiments of the present invention are directed to a slope detector for voltage droop monitoring. A non-limiting example computer-implemented method includes receiving an input voltage by a circuit. The method also includes producing, by the circuit, a filtered offset voltage based on the input voltage. The method also includes determining whether the input voltage is lower than the filtered offset voltage. The method also includes, based on the input voltage being lower than the filtered offset voltage, indicating an imminent voltage droop condition in the input voltage.

Other embodiments of the present invention implement features of the above-described method in systems and apparatuses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the present invention provide a slope detector for voltage droop monitoring. A voltage droop monitor may compare a regulated supply voltage to a reference value in order to detect when the regulated supply voltage droops below a threshold. Knowledge of a droop event may trigger a supply regulation circuit that increases the regulated supply voltage to compensate for the droop, or may lower the processor frequency to mitigate timing violations that may occur at lower supply voltage. If a voltage droop monitor signals after a voltage droop has occurred, the regulated supply voltage may be maintained at a relatively high level above the minimum required by the processor, so as to maintain the regulated supply voltage at an appropriate level under droop conditions. This increased supply voltage may increase processor power consumption.

Embodiments of a slope detector for voltage droop monitoring may include adding a fixed offset to an input voltage (e.g., a rail voltage of an integrated circuit) that is being monitored for voltage droop, and low pass filtering the offset voltage. The input voltage and the filtered offset voltage are compared to detect the occurrence of a voltage droop in the input voltage having a magnitude and time scale above a slope threshold. For a decrease in the input voltage that has a relatively small slope, the filtered offset voltage may track the input voltage, and no voltage droop condition may be detected. For a decrease in the input voltage that has a relatively large slope, the filtered offset voltage may change comparatively slowly, such that the input voltage drops lower than the filtered offset voltage, and an imminent voltage droop condition in the input voltage may be detected. Slope-based voltage droop monitoring may enable detection of an imminent voltage droop just as the droop is starting, allowing compensatory measures to be taken in a predictive rather than reactive manner.

Figure 1:
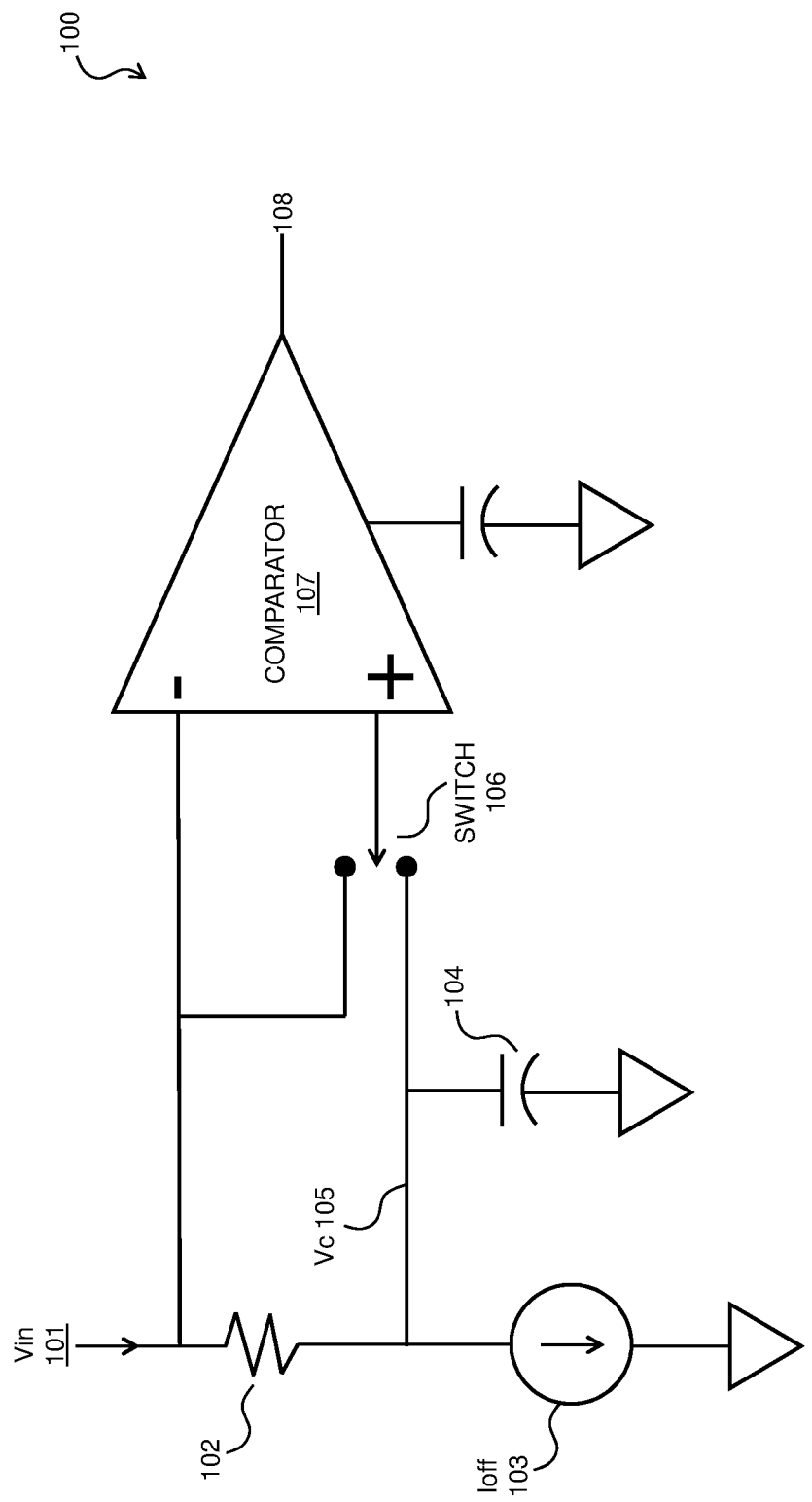
FIG. 1 is a block diagram of components of a circuit for a slope detector for voltage droop monitoring in accordance with one or more embodiments of the present invention.

Turning now to FIG. 1, circuit 100 that includes a slope detector for voltage droop monitoring is generally shown in accordance with one or more embodiments of the present invention. Circuit 100 receives an input supply voltage $V_{in}$ 101. In some embodiments, $V_{in}$ 101 may be a rail voltage of an integrated circuit that is being monitored for voltage droop. $V_{in}$ is directly connected to an inverting terminal of a comparator 107. $V_{in}$ 101 is also provided to an offset circuit comprising resistor 102 and current source $I_{off}$ 103. Resistor 102 and $I_{off}$ 103 introduce an offset into $V_{in}$ 101, to produce filtered offset voltage $V_c$ 105. $V_c$ 105 is low pass filtered by an RC filter comprising resistor 102 and capacitor 104.

The non-inverting terminal of the comparator 107 is connected to a switch 106. Switch 106 switches between two nodes based on a clock signal. In an autozero mode of the comparator 107, the switch 106 connects to $V_{in}$ 101. In the autozero mode, both terminals of the comparator 107 are connected to $V_{in}$ 101, and an autozero operation may remove any inherent amplifier offset in comparator 107 and set a trip point of the comparator 107 at a zero volt differential. In a compare mode of the comparator 107, the switch 106 connects to $V_c$ 105. In compare mode, the comparator 107 determines a difference between $V_{in}$ 101 and $V_c$ 105, and, based on whether the determined difference is positive or negative, outputs a voltage droop detection signal on output 108. Because $V_c$ 105 is a low pass filtered version of $V_{in}$ 101 that includes a voltage offset that is determined by the combination of resistor 102 and Ioff 103, if $V_{in}$ 101 decreases relatively rapidly (e.g., with a relatively large slope), $V_c$ 105 may change relatively slowly due to the RC filter comprising resistor 102 and capacitor 104. Therefore, the droop detection signal at the comparator output 108 may toggle based on $V_{in}$ 101 being lower than $V_c$ 105 to indicate an imminent voltage droop condition in $V_{in}$ 101. If $V_{in}$ 101 decreases relatively slowly (e.g., with a relatively small slope), $V_c$ 105 may track $V_{in}$ 101, such that the difference between $V_{in}$ 101 and $V_c$ 105 may be relatively constant based on the offset that was introduced into $V_c$ 105, and the droop detection signal at the comparator output 108 may not toggle, to indicate that no imminent voltage droop condition is detected by circuit 100. The circuit 100 may have a trip point that is sensitive to the slope of $V_{in}$ 101, based on the offset voltage and the cutoff frequency of the RC filter comprising resistor 102 and capacitor 104 that produce $V_c$ 105.

It is to be understood that the block diagram of FIG. 1 is not intended to indicate that the circuit 100 is to include all of the components shown in FIG. 1. Rather, the circuit 100 can include any appropriate fewer or additional components not illustrated in FIG. 1 (e.g., additional connections, clock signals, switches, inputs, outputs, resistors, capacitors, current sources, comparators, etc.). Further, the various elements of circuit 100 (e.g., resistors, current sources, capacitors, etc.) may each have any appropriate value in various embodiments. Further, the embodiments described herein with respect to circuit 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
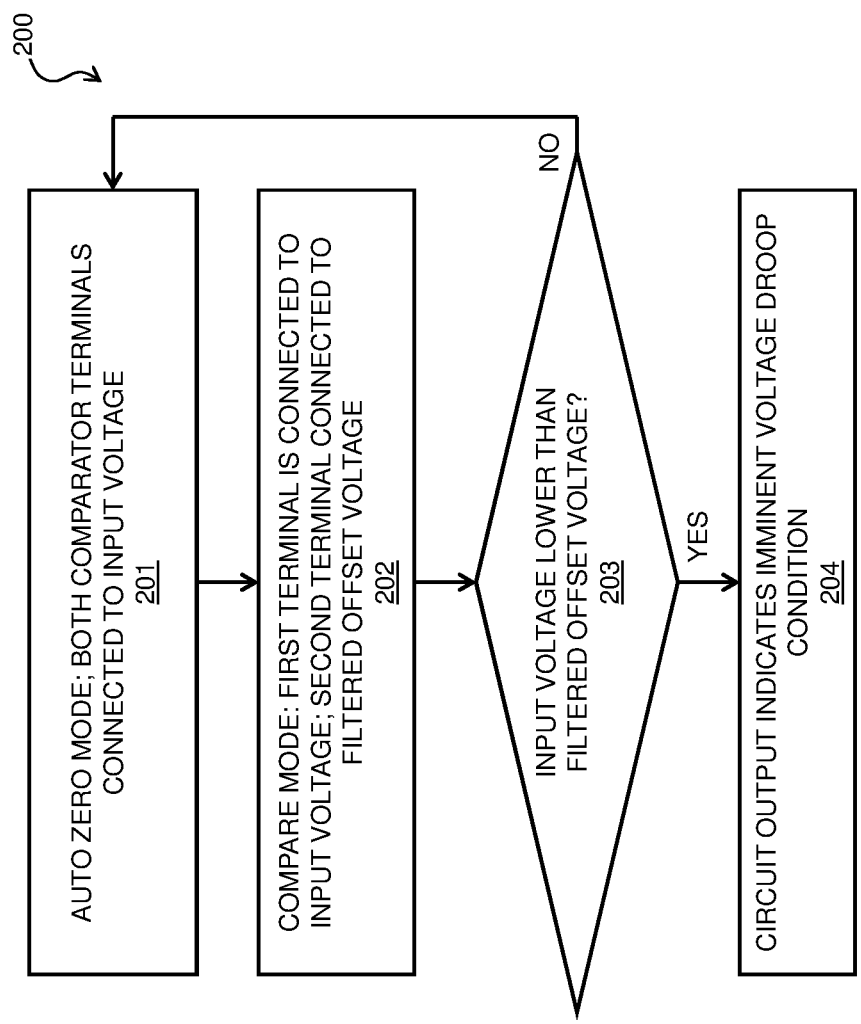
FIG. 2 is a flow diagram of a process for a slope detector for voltage droop monitoring in accordance with one or more embodiments of the present invention.

FIG. 2 shows a process flow diagram of a method 200 for a slope detector for voltage droop monitoring in accordance with one or more embodiments of the present invention. Embodiments of FIG. 2 may be implemented in a circuit such as circuit 100 of FIG. 1. In block 201, the circuit is in an autozero mode. In the autozero mode, both terminals of a comparator of the circuit (e.g., comparator 107 of circuit 100 of FIG. 1) are connected to an input voltage (e.g., $V_{in}$ 101) that is being monitored by the circuit. In the autozero mode, any inherent amplifier offset in the comparator may be removed by an autozero operation.

In block 202 of method 200, the circuit switches to a compare mode. In the compare mode, a first terminal of the comparator stays connected to the input voltage (e.g., $V_{in}$ 101), and a second terminal of the comparator is connected to a filtered offset voltage (e.g., $V_c$ 105). The filtered offset voltage may be produced by providing the input voltage to a resistor (e.g., resistor 102) and a current source (e.g., $I_{off}$ 103) that introduce the offset, and low pass filtering the offset voltage by an RC filter comprising the resistor (e.g., resistor 102) and a capacitor (e.g., capacitor 104). In some embodiments, a non-inverting terminal of the comparator may be connected to the filtered offset voltage via a switch (e.g., switch 106) in block 202. The circuit may switch between the compare mode of block 202 and the autozero mode of block 201 based on a clock signal that is provided to the switch (e.g., switch 106) that is connected to one of the comparator terminals.

In block 203, in the compare mode, the comparator determines whether the input voltage is lower than the filtered offset voltage. If there is a decrease in the input voltage that has a relatively small slope, the filtered offset voltage may track the input voltage, such that the input voltage stays above the filtered offset voltage by a relatively constant difference based on the offset that was introduced into the filtered offset voltage by the offset circuit. If the input voltage is higher than the filtered offset voltage in block 203, a droop detection signal at the comparator output (e.g., output 108) indicates that no imminent voltage droop condition has been detected. Flow returns from block 203 to block 201, and the circuit enters the autozero mode.

If there is a decrease in the input voltage that has a relatively large slope, the filtered offset voltage may decrease relatively slowly as compared to the input voltage, such that the input voltage may drop below the filtered offset voltage and the difference between the input voltage and the filtered offset voltage may change from positive to negative. If the input voltage is determined to be lower than the filtered offset voltage in block 203, flow proceeds from block 203 to block 204. In block 204, the droop detection signal at the comparator output (e.g., output 108) indicates an imminent voltage drop condition in the input voltage. The voltage droop condition may be detected predictively in blocks 203-204 by the circuit based on the relatively large slope of the decrease in the input voltage, allowing compensatory measures to be taken based on the droop detection signal just as the voltage droop condition actually starts in the input voltage in some embodiments.

The process flow diagram of FIG. 2 is not intended to indicate that the operations of the method 200 are to be executed in any particular order, or that all of the operations of the method 200 are to be included in every case. Additionally, the method 200 can include any suitable number of additional operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving an input voltage by a circuit;
   producing, by the circuit, a filtered offset voltage based on the input voltage, wherein producing the filtered offset voltage based on the input voltage comprises:
      introducing an offset into the input voltage by an offset circuit comprising a resistor and a current source; and
      filtering the input voltage including the offset by a low pass filter comprising the resistor and a capacitor;
   determining whether the input voltage is lower than the filtered offset voltage; and
   based on the input voltage being lower than the filtered offset voltage, indicating, by the circuit, an imminent voltage droop condition in the input voltage.

2. The method of claim 1, the method comprising:
   based on the input voltage being higher than the filtered offset voltage, indicating, by the circuit, no imminent voltage droop condition in the input voltage.

3. The method of claim 1, the circuit comprising:
   a comparator, the comparator comprising a first terminal and a second terminal, and a comparator output that outputs a voltage droop detection signal based on whether the input voltage is lower than the filtered offset voltage; and
   a switch that is connected to the second terminal.

4. The method of claim 3, wherein determining whether the input voltage is lower than the filtered offset voltage comprises connecting the first terminal to the input voltage, and connecting the second terminal to the filtered offset voltage via the switch.

5. The method of claim 4, comprising:
   connecting the second terminal to the input voltage via the switch; and
   performing an autozero operation in the comparator, wherein a comparator offset is removed based on the autozero operation.

6. The method of claim 4, wherein the first terminal comprises an inverting terminal of the comparator, and the second terminal comprises a non-inverting terminal of the comparator.

7. A system, comprising a circuit configured to:
   receive an input voltage;
   produce a filtered offset voltage based on the input voltage;
   determine whether the input voltage is lower than the filtered offset voltage; and
   based on the input voltage being lower than the filtered offset voltage, indicate an imminent voltage droop condition in the input voltage, wherein the circuit comprises:

an offset circuit comprising a resistor and a current source, wherein the offset circuit is configured to introduce an offset in the input voltage; and a low pass filter comprising the resistor and a capacitor, wherein the low pass filter is configured to filter the input voltage including the offset to produce the filtered offset voltage.

8. The system of claim 7, the circuit configured to:
based on the input voltage being higher than the filtered offset voltage, indicate no imminent voltage droop condition in the input voltage.

9. The system of claim 7, the circuit comprising:
a comparator, the comparator comprising a first terminal and a second terminal, and a comparator output that outputs a voltage droop detection signal based on whether the input voltage is lower than the filtered offset voltage; and
a switch that is connected to the second terminal.

10. The system of claim 9, wherein determining whether the input voltage is lower than the filtered offset voltage comprises connecting the first terminal to the input voltage, and connecting the second terminal to the filtered offset voltage via the switch.

11. The system of claim 10, the circuit further configured to:
connect the second terminal to the input voltage via the switch; and
perform an autozero operation in the comparator, wherein a comparator offset is removed based on the autozero operation.

12. The system of claim 10, wherein the first terminal comprises an inverting terminal of the comparator, and the second terminal comprises a non-inverting terminal of the comparator.

13. An apparatus comprising logic configured to:
receive an input voltage;
produce a filtered offset voltage based on the input voltage;
determine whether the input voltage is lower than the filtered offset voltage; and
based on the input voltage being lower than the filtered offset voltage, indicate an imminent voltage droop condition in the input voltage, wherein the logic comprises:
an offset circuit comprising a resistor and a current source, wherein the offset circuit is configured to introduce an offset in the input voltage; and
a low pass filter comprising the resistor and a capacitor, wherein the low pass filter is configured to filter the input voltage including the offset to produce the filtered offset voltage.

14. The apparatus of claim 13, the logic configured to:
based on the input voltage being higher than the filtered offset voltage, indicate no imminent voltage droop condition in the input voltage.

15. The apparatus of claim 13, the logic comprising:
a comparator, the comparator comprising a first terminal and a second terminal, and a comparator output that outputs a voltage droop detection signal based on whether the input voltage is lower than the filtered offset voltage; and
a switch that is connected to the second terminal.

16. The apparatus of claim 15, wherein determining whether the input voltage is lower than the filtered offset voltage comprises connecting the first terminal to the input voltage, and connecting the second terminal to the filtered offset voltage via the switch.

17. The apparatus of claim 16, the logic further configured to:
connect the second terminal to the input voltage via the switch; and
perform an autozero operation in the comparator, wherein a comparator offset is removed based on the autozero operation.

* * * * *